(12) United States Patent
Cho et al.

(10) Patent No.: US 10,804,158 B2
(45) Date of Patent: Oct. 13, 2020

(54) METHODS OF FABRICATING SEMICONDUCTOR DEVICES INCLUDING DIFFERING BARRIER LAYER STRUCTURES

(71) Applicant: SAMSUNG ELECTRONICS CO., LTD., Suwon-si (KR)

(72) Inventors: Namgyu Cho, Seoul (KR); Kughwan Kim, Suwon-si (KR); Geunwoo Kim, Seoul (KR); Jungmin Park, Seoul (KR); Minwoo Song, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/785,236

(22) Filed: Feb. 7, 2020

(65) Prior Publication Data
US 2020/0176317 A1 Jun. 4, 2020

Related U.S. Application Data

(63) Continuation of application No. 16/185,213, filed on Nov. 9, 2018, now Pat. No. 10,593,597.

(30) Foreign Application Priority Data

Apr. 10, 2018 (KR) ........................ 10-2018-0041418

(51) Int. Cl.
*H01L 21/82* (2006.01)
*H01L 29/40* (2006.01)
(Continued)

(52) U.S. Cl.
CPC .. *H01L 21/82345* (2013.01); *H01L 21/32134* (2013.01); *H01L 29/401* (2013.01); *H01L 29/66545* (2013.01); *H01L 21/823431* (2013.01)

(58) Field of Classification Search
CPC ......... H01L 21/82345; H01L 21/32134; H01L 29/401; H01L 29/66545; H01L 21/823431
(Continued)

(56) References Cited

U.S. PATENT DOCUMENTS 9,218,969 B2 12/2015 Kim et al.
9,362,284 B2 6/2016 Togo et al.
(Continued)

FOREIGN PATENT DOCUMENTS

KR 2012-0061209 A 6/2012

OTHER PUBLICATIONS

Notice of Allowance issued in parent U.S. Appl. No. 16/185,213 dated Nov. 6, 2019.

*Primary Examiner* — Sheikh Maruf
(74) *Attorney, Agent, or Firm* — Sughrue Mion, PLLC

(57) ABSTRACT

A method of fabricating a semiconductor device may include forming a first conductive layer on first to third regions of a substrate, forming a barrier layer on the first conductive layer, the barrier layer including a first barrier layer, a second barrier layer, and a sacrificial layer which are sequentially formed, sequentially forming a second conductive layer and a third conductive layer on the barrier layer, performing a first etching process to remove the third conductive layer from the second region and the third region, the third conductive layer remaining on the first region after the first etching process, and performing a second etching process to remove the second conductive layer and the sacrificial layer from the third region, the second conductive layer and the sacrificial layer remaining on the first region and on the second region after the second etching process.

20 Claims, 14 Drawing Sheets

(51) Int. Cl.
  *H01L 29/66* (2006.01)
  *H01L 21/8234* (2006.01)
  *H01L 21/3213* (2006.01)

(58) Field of Classification Search
  USPC ........................................................ 438/587
  See application file for complete search history.

(56) References Cited

U.S. PATENT DOCUMENTS

| | | | |
|---|---|---|---|
| 9,384,984 | B2 | 7/2016 | Lin et al. |
| 9,431,304 | B2 | 8/2016 | Huang et al. |
| 9,524,968 | B1 | 12/2016 | Lai et al. |
| 9,553,092 | B2 | 1/2017 | Bao et al. |
| 10,115,796 | B2 | 10/2018 | Chen |
| 2009/0152636 | A1* | 6/2009 | Chudzik ............. H01L 29/4975 257/369 |
| 2010/0264497 | A1* | 10/2010 | Chang ................ H01L 29/7856 257/393 |
| 2011/0193162 | A1* | 8/2011 | Chuang ............ H01L 29/66659 257/343 |
| 2012/0280330 | A1* | 11/2012 | Lee ................ H01L 21/823431 257/392 |
| 2012/0292715 | A1* | 11/2012 | Hong .................... H01L 21/845 257/392 |
| 2013/0026578 | A1 | 1/2013 | Tsau |
| 2013/0154019 | A1* | 6/2013 | Ando ................ H01L 21/28079 257/369 |
| 2014/0061814 | A1* | 3/2014 | Kim ................ H01L 21/823857 257/369 |
| 2014/0117466 | A1* | 5/2014 | Jagannathan ..... H01L 21/28229 257/411 |
| 2015/0021699 | A1* | 1/2015 | Ando .................... H01L 21/845 257/368 |
| 2015/0214112 | A1 | 7/2015 | Zhao |
| 2015/0380407 | A1 | 12/2015 | Ji et al. |
| 2016/0027664 | A1 | 1/2016 | Ando et al. |
| 2016/0276157 | A1 | 9/2016 | Lin et al. |
| 2016/0358920 | A1 | 12/2016 | Kim |
| 2016/0372565 | A1 | 12/2016 | Huang et al. |
| 2017/0047330 | A1 | 2/2017 | Lai et al. |
| 2017/0062282 | A1 | 3/2017 | Lin et al. |
| 2017/0069634 | A1* | 3/2017 | Kim ................ H01L 21/823857 |
| 2017/0133278 | A1 | 5/2017 | Bao et al. |
| 2017/0148792 | A1* | 5/2017 | Kim ........................ H01L 29/78 |
| 2017/0200655 | A1 | 7/2017 | Zhao et al. |
| 2017/0213826 | A1* | 7/2017 | Kim .................... H01L 29/7854 |
| 2017/0278744 | A1 | 9/2017 | Wang et al. |
| 2018/0151451 | A1* | 5/2018 | Li ......................... H01L 27/11 |

* cited by examiner

METHODS OF FABRICATING SEMICONDUCTOR DEVICES INCLUDING DIFFERING BARRIER LAYER STRUCTURES

CROSS-REFERENCE TO RELATED APPLICATION

This is a continuation of U.S. application Ser. No. 16/185,213 filed on Nov. 9, 2018, which claims priority under 35 U.S.C. § 119 to Korean Patent Application No. 10-2018-0041418, filed on Apr. 10, 2018 in the Korean Intellectual Property Office, the entire contents of which are hereby incorporated by reference herein in their entirety.

FIELD

Embodiments of the present inventive concepts relate to methods of fabricating semiconductor devices, and in particular, to methods of fabricating semiconductor devices having three-dimensional channel regions.

BACKGROUND

A semiconductor device may include an integrated circuit including metal-oxide-semiconductor field-effect transistors (MOS-FETs). With an increasing integration density of the semiconductor device, MOS-FETs are being scaled down, and this leads to deterioration in operational characteristics of the semiconductor device. Furthermore, it is becoming harder to achieve transistor performance required by a user. Various FET structures have been suggested to overcome these technical issues. For example, a high-k metal gate structure has been proposed to replace a conventional FET, in which a silicon oxide layer and a polysilicon layer are used for a gate insulating layer and a gate electrode, respectively.

SUMMARY

Some embodiments of the inventive concepts provide methods capable of reducing a process variation in a process of fabricating a semiconductor device. Some embodiments of the inventive concepts provide methods capable of increasing a process yield in a process of fabricating a semiconductor device.

According to some embodiments of the inventive concepts, a method of fabricating a semiconductor device may include forming a first conductive layer on first to third regions of a substrate, forming a barrier layer on the first conductive layer, the barrier layer including a first barrier layer, a second barrier layer, and a sacrificial layer which are sequentially formed, sequentially forming a second conductive layer and a third conductive layer on the barrier layer, performing a first etching process to remove the third conductive layer from the second region and the third region, the third conductive layer remaining on the first region after the first etching process, and performing a second etching process to remove the second conductive layer and the sacrificial layer from the third region, the second conductive layer and the sacrificial layer remaining on the first region and on the second region after the second etching process.

According to some embodiments of the inventive concepts, a method of fabricating a semiconductor device may include forming a sacrificial gate pattern that crosses an active pattern of a substrate, forming a pair of spacers on opposing sides of the sacrificial gate pattern, removing the sacrificial gate pattern to form a gate trench defined by the pair of spacers on a first region of the substrate, a second region of the substrate, and on a third region of the substrate, sequentially forming a first conductive layer, a first barrier layer, a second barrier layer, a sacrificial layer, a second conductive layer, and a third conductive layer in the gate trench, performing a first etching process to remove the third conductive layer from the second region and from the third region, the third conductive layer remaining on the first region after the first etching process, and performing a second etching process to remove the second conductive layer and the sacrificial layer from the third region, the second conductive layer remaining on the first region and on the second region after the second etching process. A roughness of a top surface of the sacrificial layer may be increased during the first etching process.

BRIEF DESCRIPTION OF THE DRAWINGS

Embodiments of the inventive concepts will be more clearly understood from the following brief description taken in conjunction with the accompanying drawings. The accompanying drawings illustrate non-limiting, example embodiments as described herein.

FIGS. 4A to 6A are cross-sectional views illustrating operations of methods of fabricating semiconductor devices, according to some embodiments of the inventive concepts.

FIGS. 4B to 6B are perspective views illustrating the first regions of FIGS. 4A to 6A, respectively, according to some embodiments of the inventive concepts.

It should be noted that these figures are intended to illustrate the general characteristics of methods, structure and/or materials utilized in some example embodiments and to supplement the written description below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
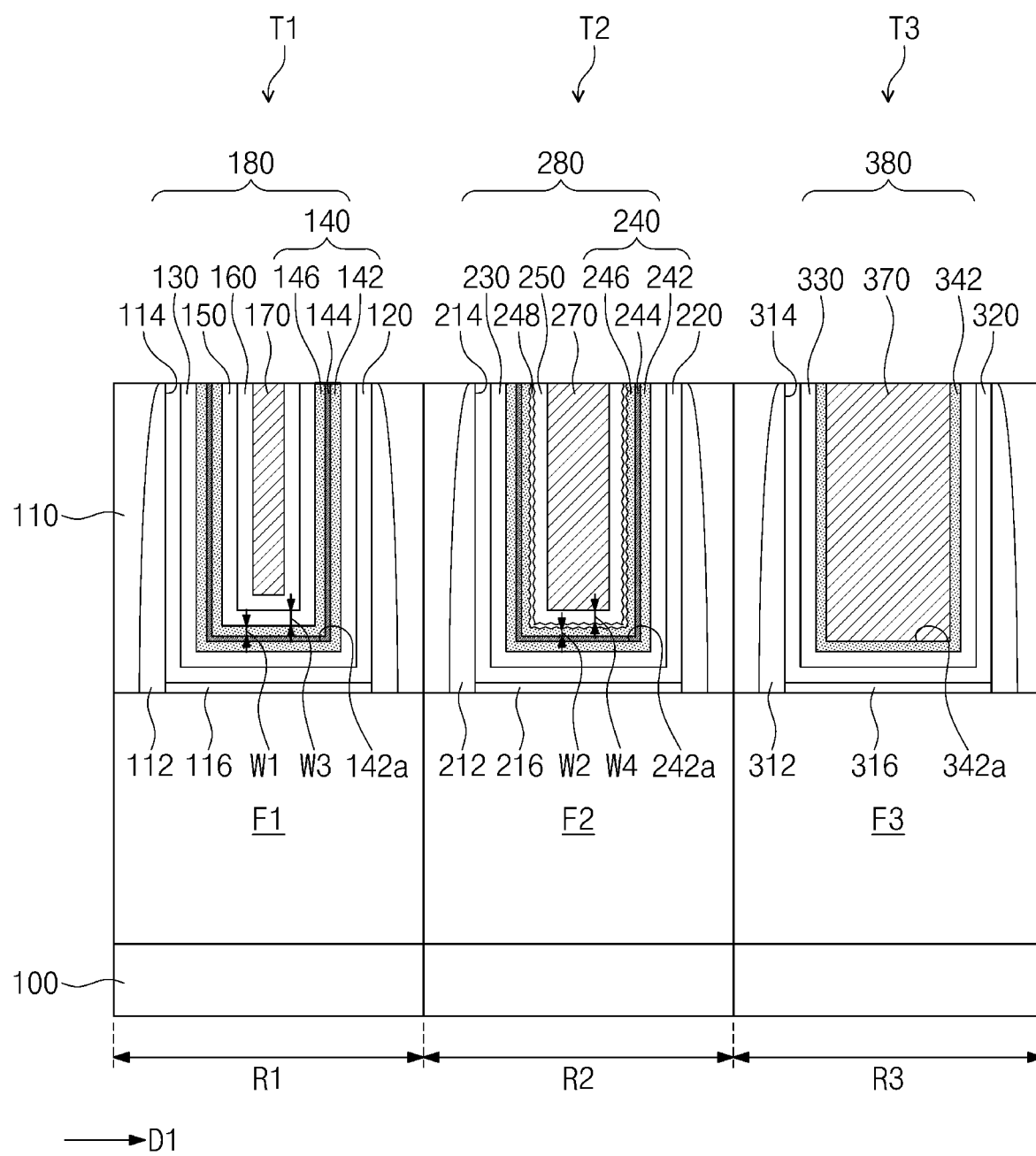
FIG. 1 is a cross-sectional view illustrating a semiconductor device according to some embodiments of the inventive concepts.
Figure 2:
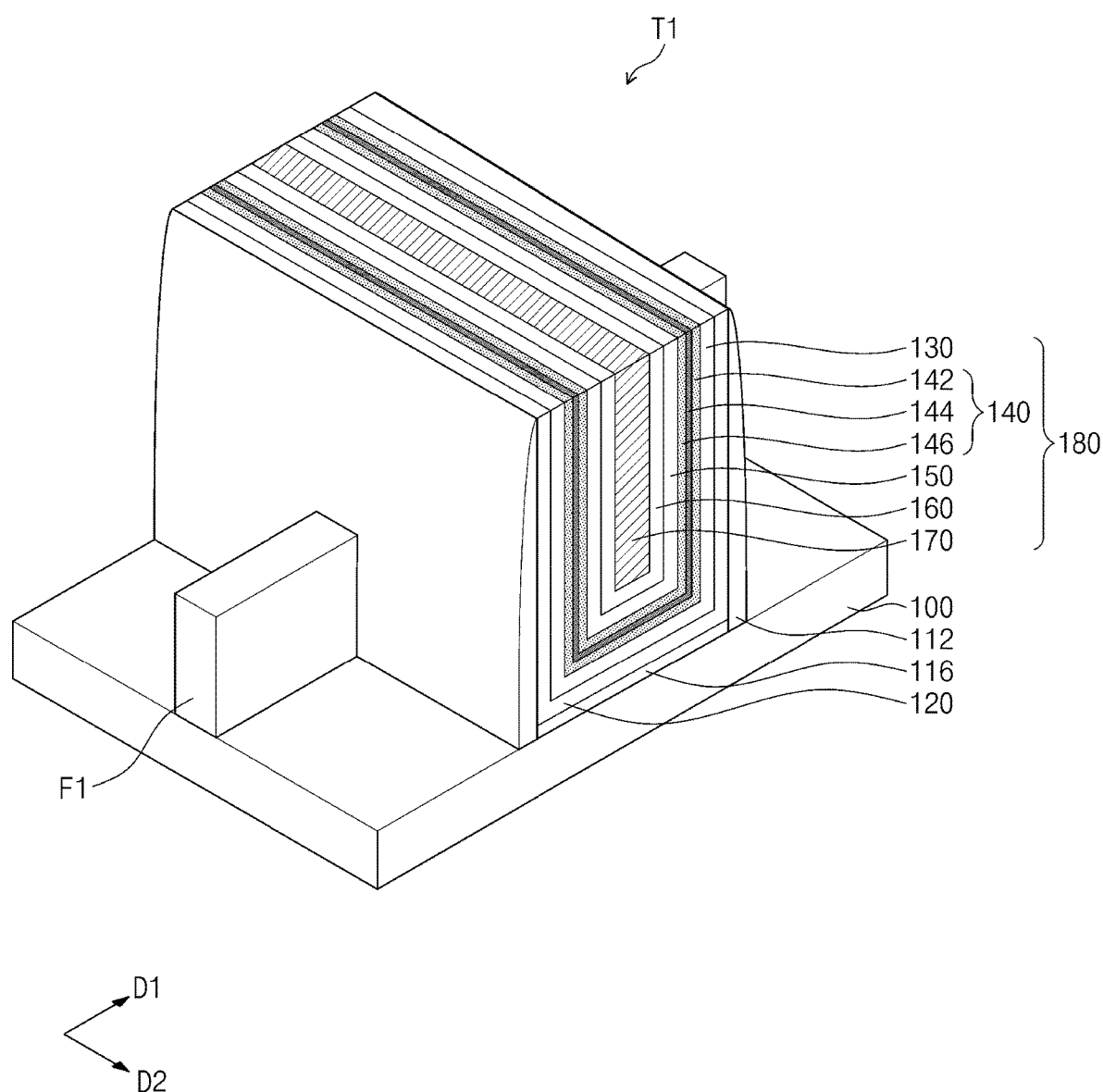
FIG. 2 is a perspective view illustrating a first transistor of FIG. 1 according to some embodiments of the inventive concepts.
Figure 3:
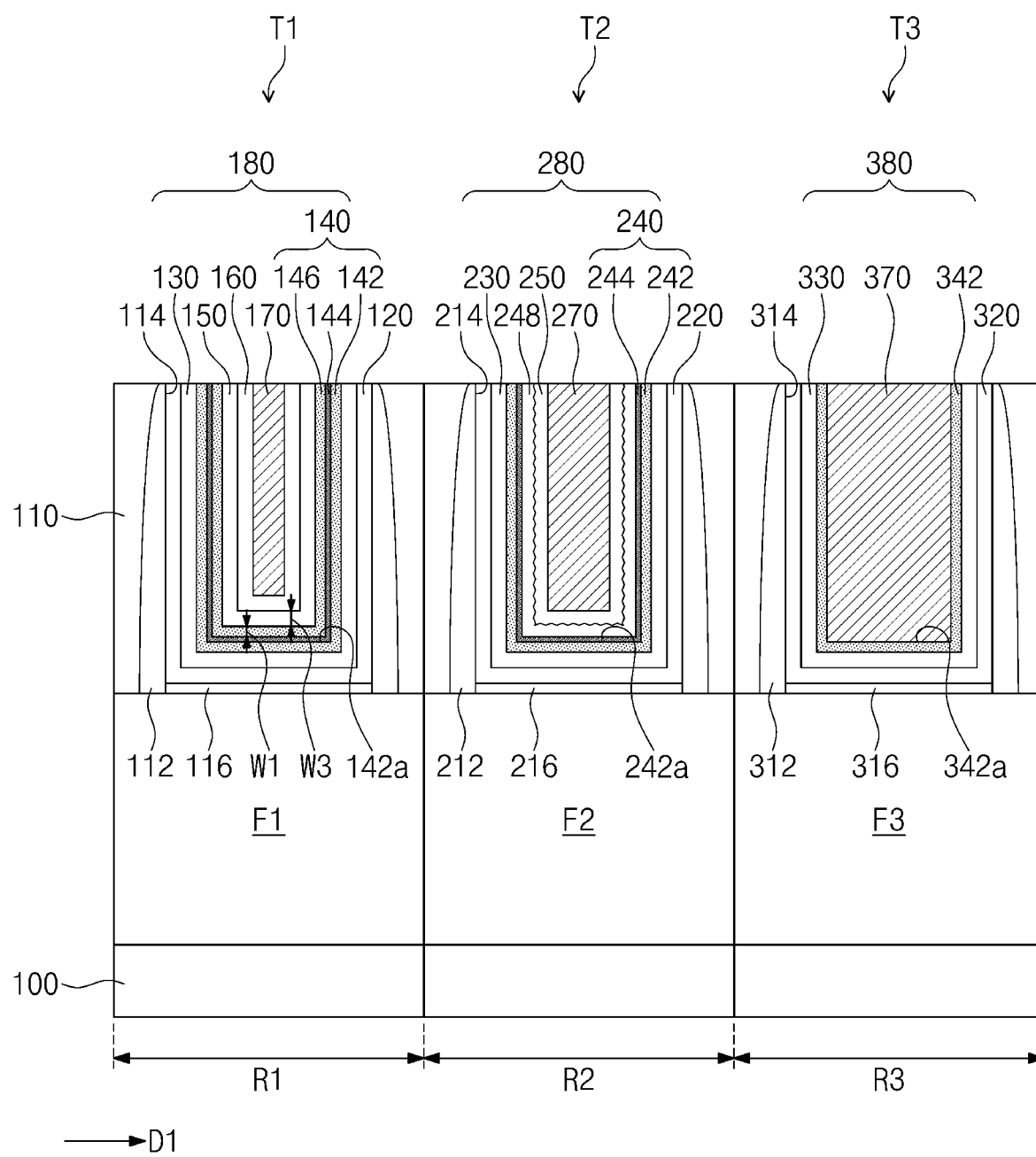
FIG. 3 is a cross-sectional view illustrating a semiconductor device according to some embodiments of the inventive concepts.

FIG. 1 is a cross-sectional view illustrating a semiconductor device according to some embodiments of the inventive concepts. FIG. 2 is a perspective view illustrating a first transistor of FIG. 1. FIG. 3 is a cross-sectional view illustrating a semiconductor device according to some embodiments of the inventive concepts.

Referring to FIG. 1, a substrate 100 may have an active region. The substrate 100 may be a semiconductor substrate. The semiconductor substrate may be, for example, a bulk silicon wafer, a silicon-on-insulator (SOI) wafer, a germanium wafer, a germanium-on-insulator (GOI) wafer, a silicon-germanium wafer, or a substrate including an epitaxial layer formed by a selective epitaxial growth (SEG) process. The bulk silicon substrate may be doped with n-type or p-type impurities. In some embodiments, the semiconductor substrate may be a III-V compound semiconductor substrate. For example, the III-V compound semiconductor substrate may be formed of or include at least one of gallium arsenide (GaAs), indium gallium arsenide (InGaAs), or aluminum gallium arsenide (AlGaAs).

First to third transistors T1, T2, and T3 having different threshold voltages may be on the substrate 100. Some embodiments may include three transistors, but embodiments of the inventive concepts are not limited thereto.

The first to third transistors T1, T2, and T3 may be on first to third regions R1, R2, and R3, respectively, of the substrate 100. Each of the first to third transistors T1, T2, and T3 may be a fin-type transistor (e.g., a fin FET) whose channel region has a three-dimensional fin structure. The first transistor T1 may be a p-type transistor, and the third transistor T3 may be an n-type transistor. Although the first to third transistors T1, T2, and T3 are illustrated in FIG. 1 to be in direct contact with each other, in some embodiments the first to third transistors T1, T2, and T3 may be spatially and electrically separated from each other.

Hereinafter, the common structural features of the first to third transistors T1, T2, and T3 will be described with reference to the first transistor T1 illustrated in FIG. 2. Some structural features of the second and third transistors T2 and T3 will be described through the comparison with the first transistor T1.

Referring to FIGS. 1 and 2, the first transistor T1 may include a fin F1, a trench 114, an interface layer 116, a dielectric layer 120, and a gate electrode 180, on the first region R1 of the substrate 100.

The fin F1 may be on the substrate 100. The fin F1 may extend in a first direction D1. The fin F1 may be a portion of the substrate 100 or may be an epitaxial pattern that is grown from the substrate 100. The fin F1 may be formed of or include a semiconductor material (e.g., silicon (Si) or germanium (Ge)). For example, the fin F1 may be formed of or include at least one of IV-IV or III-V compound semiconductor materials. The IV-IV compound semiconductor materials may include binary or ternary compounds, in which at least two different elements of carbon (C), silicon (Si), germanium (Ge), or tin (Sn) are contained, or which is doped with a group IV element. Furthermore, the III-V compound semiconductor materials may include binary, ternary, or quaternary compounds, in which at least one of group III elements (e.g., aluminum (Al), gallium (Ga), and indium (In)) and at least one of group V elements (e.g., phosphorus (P), arsenic (As), and antimony (Sb)) are contained.

An interlayered insulating layer 110 may be on the substrate 100. The trench 114 may be in the interlayered insulating layer 110. The trench 114 may extend in a second direction D2 crossing the first direction D1.

The interface layer 116 may be in the trench 114. The interface layer 116 may cover a bottom surface of the trench 114 and may expose a side surface of the trench 114. In some embodiments, the interface layer 116 may include a silicon oxide layer.

The dielectric layer 120 may be along inner surfaces of the trench 114. For example, the dielectric layer 120 may conformally cover the side and bottom surfaces of the trench 114. The dielectric layer 120 may include a high-k dielectric insulating layer. For example, the dielectric layer 120 may be an insulating layer containing hafnium (Hf) or zirconium (Zr). As an example, the dielectric layer 120 may be formed of or include at least one of hafnium oxide ($HfO_2$), hafnium silicon oxide ($HfSiO_2$), hafnium oxynitride (HfON), zirconium oxide ($ZrO_2$), zirconium silicon oxide ($ZrSiO_4$), tantalum oxide ($Ta_2O_5$), titanium oxide ($TiO_2$), barium strontium titanium oxide (BSTO), barium titanium oxide ($BaTiO_3$), strontium titanium oxide ($SrTiO_3$), yttrium oxide ($Y_2O_3$), lead scandium tantalum oxide (PST), or lead-zinc niobate (PZN).

The gate electrode 180 may be in the trench 114. The gate electrode 180 may include a first conductive layer 130, a barrier layer 140, a second conductive layer 150, a third conductive layer 160, and a conductive pattern 170.

The first conductive layer 130 may be on the dielectric layer 120 in the trench 114. The first conductive layer 130 may be along the side and bottom surfaces of the trench 114. The first conductive layer 130 may be used to adjust a work function of the gate electrode 180. The first conductive layer 130 may be formed of or include at least one of binary metal nitride compounds (e.g., titanium nitride (TiN) and tantalum nitride (TaN)), ternary metal nitride compounds (e.g., titanium aluminum nitride (TiAlN), tantalum aluminum nitride (TaAlN), titanium silicon nitride (TiSiN), and tantalum silicon nitride (TaSiN)), or metal oxynitride compounds formed by oxidation thereof.

The barrier layer 140 may be on the first conductive layer 130 in the trench 114. The barrier layer 140 may be along the side and bottom surfaces of the trench 114. The barrier layer 140 may be used to prevent the first conductive layer 130 from being unintentionally etched during a fabrication process of a semiconductor device or may be used as an etch stop layer. The barrier layer 140 may include a first barrier layer 142, a second barrier layer 144, and a sacrificial layer 146, which are sequentially on the first conductive layer 130. The first barrier layer 142 may have a lattice constant that is equal or similar to that of the first conductive layer 130. The first barrier layer 142 may be formed of or include a metal nitride material whose metallic element is different from that of the first conductive layer 130. As an example, the first barrier layer 142 may be formed of or include at least one of tantalum nitride (TaN), tungsten nitride (WN), silicon nitride (SiN), or aluminum nitride (AlN). The sacrificial layer 146 may have a lattice constant that is equal or similar to that of the second conductive layer 150. The sacrificial layer 146 may be formed of or include a metal nitride material whose metallic element is different from that of the second conductive layer 150. The sacrificial layer 146 may be formed of or include, for example, at least one of tantalum nitride (TaN), tungsten nitride (WN), silicon nitride (SiN), or aluminum nitride (AlN). In some embodiments, the first barrier layer 142 and the sacrificial layer 146 may be formed of the same material, but embodiments of the inventive concepts are not limited thereto. The second barrier layer 144 may be buried or interposed between the first barrier layer 142 and the sacrificial layer 146. The second barrier layer 144 may be formed of or include a metal oxide material, whose metallic element is the same as those in the first barrier layer 142 and the sacrificial layer 146. As an example, the second barrier layer 144 may be formed of or include tantalum oxide (TaOx), tungsten oxide (WO$_x$), silicon oxide (SiO$_2$), or aluminum oxide (Al$_2$O$_3$).

The second conductive layer 150 may be on the barrier layer 140 in the trench 114. The second conductive layer 150 may be along the side and bottom surfaces of the trench 114. The second conductive layer 150 may be used to adjust a work function of the gate electrode 180. The second conductive layer 150 may have a work function that is smaller than that of the first conductive layer 130. The second conductive layer 150 may be formed of or include at least one of aluminum-containing metal compounds, oxides thereof, nitrides thereof, or carbides thereof. In some embodiments, the second conductive layer 150 may be formed of or include at least one of titanium aluminum carbide (TiAlC), titanium aluminum nitride (TiAlN), titanium aluminum carbon nitride (TiAlCN), or titanium aluminum (TiAl).

The third conductive layer 160 may be on the second conductive layer 150 in the trench 114. The third conductive layer 160 may be along the side and bottom surfaces of the trench 114. The third conductive layer 160 may be used to adjust a work function of the gate electrode 180. The third conductive layer 160 may have a work function that is smaller than that of the second conductive layer 150. The third conductive layer 160 may be formed of or include at least one of binary metal nitride compounds (e.g., titanium nitride (TiN) and tantalum nitride (TaN)), ternary metal nitride compounds (e.g., titanium aluminum nitride (TiAlN), tantalum aluminum nitride (TaAlN), titanium silicon nitride (TiSiN), and tantalum silicon nitride (TaSiN)), or metal oxynitride compounds formed by oxidation thereof. In some embodiments, the second conductive layer 150 and the third conductive layer 160 may be formed of different materials.

The conductive pattern 170 may be on the third conductive layer 160 in the trench 114. The conductive pattern 170 may fill an unfilled space of the trench 114 having the third conductive layer 160. The conductive pattern 170 may be formed of or include at least one of tungsten (W) or aluminum (Al).

Some elements of the second and third transistor T2 and T3 may be substantially the same or similar to those of the first transistor T1.

The second transistor T2 may include a fin F2, a trench 214, an interface layer 216, a dielectric layer 220, and a gate electrode 280, on the second region R2 of the substrate 100. The gate electrode 280 of the second transistor T2 may include a first conductive layer 230, a barrier layer 240, a second conductive layer 250, and a conductive pattern 270 but may not include the third conductive layer. The barrier layer 240 of the second transistor T2 may include a first barrier layer 242, a second barrier layer 244, and a sacrificial layer 246. In comparison with the first transistor T1, the gate electrode 280 of the second transistor T2 may further include an intermixing layer 248 between the second conductive layer 250 and the sacrificial layer 246. Thus, a thickness w2 of the sacrificial layer 246 of the second transistor T2 may be less than a thickness w1 of the sacrificial layer 146 of the first transistor T1, and a thickness w4 of the second conductive layer 250 of the second transistor T2 may be less than a thickness w3 of the second conductive layer 150 of the first transistor T1. A top or bottom surface of the intermixing layer 248 of the second transistor T2 may have roughness higher than a substantially flat top surface 142a of the first barrier layer 142. Thus, a top surface of the sacrificial layer 246 in contact with the bottom surface of the second conductive layer 250 of the second transistor T2 may also have roughness higher than a top surface 242a of the first barrier layer 242. The intermixing layer 248 may be formed of or include metal oxynitride. The intermixing layer 248 may be formed of an oxynitride material, in which a metallic element of the sacrificial layer 246 and a metallic element of the second conductive layer 250 are contained. As an example, in the case where the sacrificial layer 246 includes tantalum nitride (TaN) and the second conductive layer 250 includes titanium nitride (TiN), the intermixing layer 248 may include titanium tantalum oxynitride (Ti/Ta—N—O).

In some embodiments, as illustrated in FIG. 3, the second transistor T2 may not have a sacrificial layer. For example, the intermixing layer 248 of the second transistor T2 may be in contact with the bottom surface of the second conductive layer 250 and the top surface of the second barrier layer 244. In such embodiments, the top surface of the intermixing layer 248 of the second transistor T2 may have roughness higher than the substantially flat top surface 242a of the first barrier layer 242, and the bottom surface of the intermixing layer 248 may be substantially flat.

Referring back to FIGS. 1 and 2, the third transistor T3 may include a fin F3, a trench 314, an interface layer 316, a dielectric layer 320, and a gate electrode 380, on the third region R3 of the substrate 100. The gate electrode 380 of the third transistor T3 may include a first conductive layer 330, a barrier layer, and a conductive pattern 370, but may not include the second and third conductive layers. The barrier layer of the third transistor T3 may include a first barrier layer 342 (hereinafter, the barrier layer of the third transistor T3 will be identified using the same reference number as the first barrier layer 342 of the third transistor T3). A top surface 342a of the first barrier layer 342 of the third transistor T3 may be substantially flat. The first barrier layer 342 of the third transistor T3 may be in contact with the conductive pattern 370.

Some elements of the first to third transistors T1, T2, and T3 may be substantially the same. For example, the fins F1, F2, and F3 of the first to third transistors T1, T2, and T3 may be formed of the same material and may have the same shape. Furthermore, the interface layers 116, 216, and 316 of the first to third transistors T1, T2, and T3 may be formed of the same material and may have the same shape.

The first conductive layers 130, 230, and 330 of the first to third transistors T1, T2, and T3 may be formed of the same material and may have the same shape. By contrast, the second conductive layers 150 and 250 of the first and second transistors T1 and T2 may be formed of the same material but, as described above, may have thicknesses different from each other. For example, the thickness w3 of the second conductive layer 150 of the first transistor T1 may be greater than the thickness w4 of the second conductive layer 250 of the second transistor T2.

The barrier layers 140, 240, and 342 of the first to third transistors T1, T2, and T3 may have layer structures different from each other. For example, the barrier layer 140 of the first transistor T1 may include the first barrier layer 142, the second barrier layer 144, and the sacrificial layer 146, the barrier layer 240 of the second transistor T2 may include the first barrier layer 242, the second barrier layer 244, the sacrificial layer 246, and the intermixing layer 248, and the barrier layer 342 of the third transistor T3 may have only the first barrier layer 342.

FIGS. 4A to 6A are cross-sectional view illustrating operations of methods of fabricating semiconductor devices, according to some embodiments of the inventive concepts. FIGS. 4B to 6B are perspective views illustrating the first regions of FIGS. 4A to 6A, respectively, according to some embodiments of the inventive concepts.

Figure 4A:
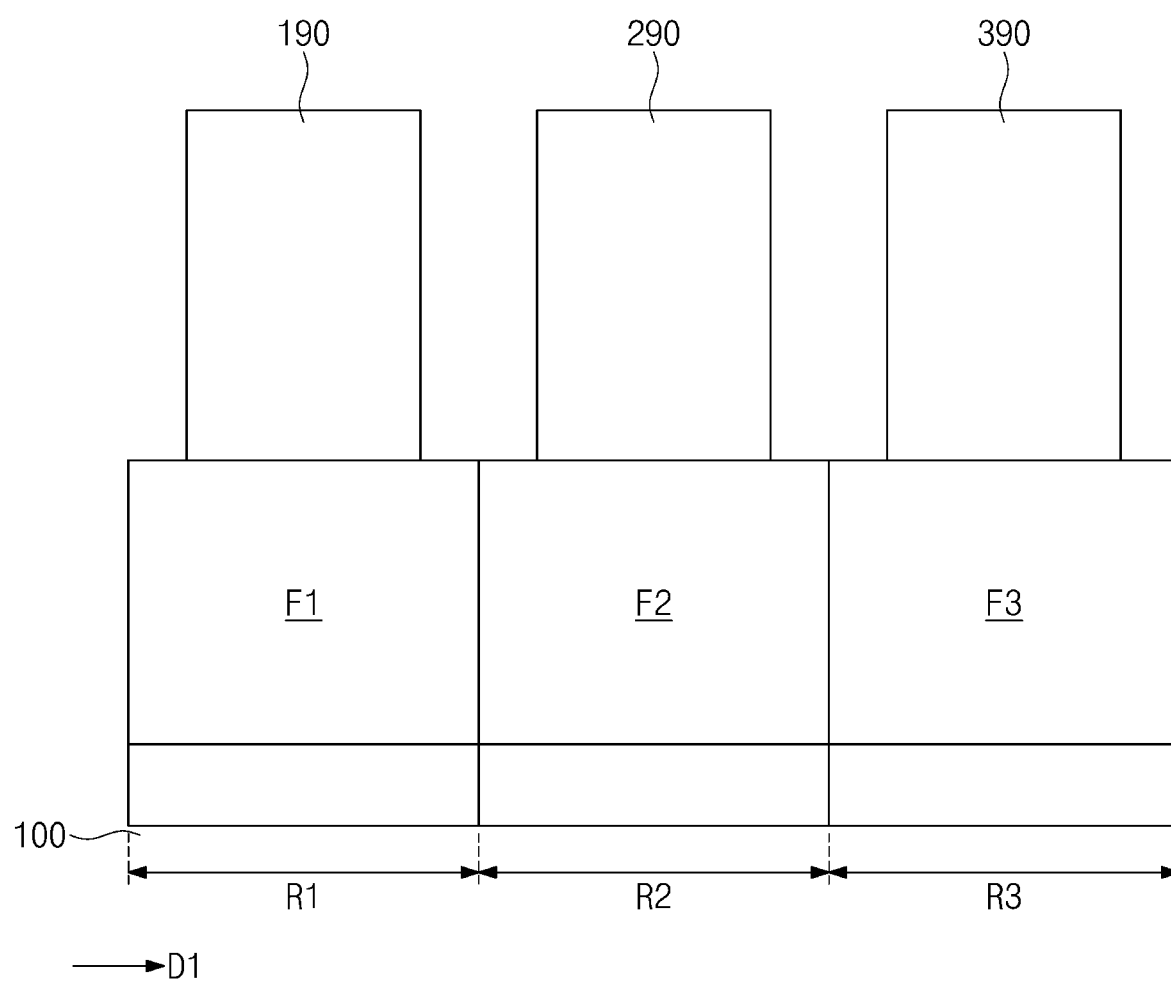
Figure 4B:
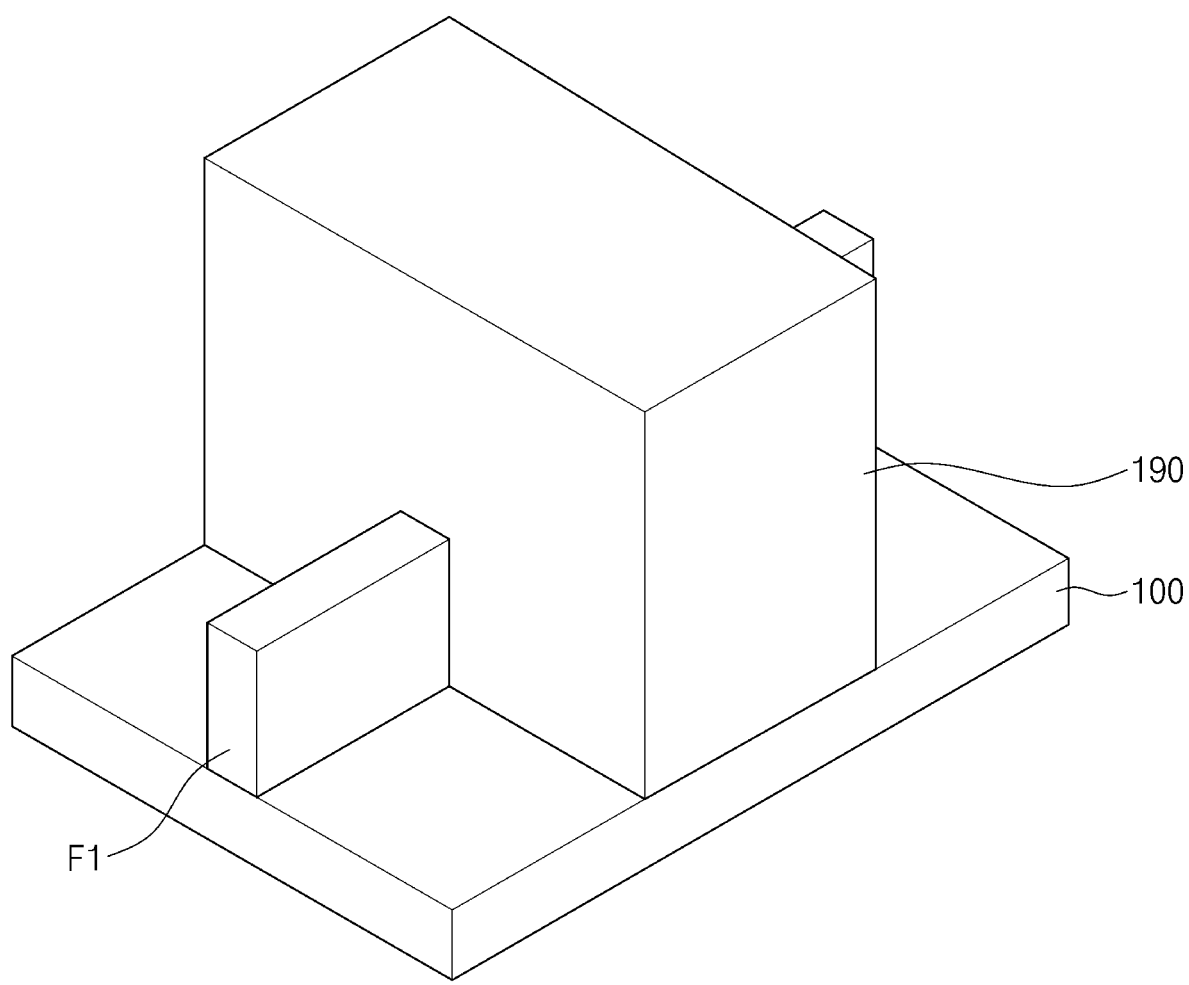

Referring to FIGS. 4A and 4B, the substrate 100 may have an active region. The substrate 100 may be a semiconductor substrate. The substrate 100 may include the first region R1, the second region R2, and the third region R3. The first region R1 may be used to form the first transistor T1 (e.g., see FIG. 1), the second region R2 may be used to form the second transistor T2 (e.g., see FIG. 1), and the third region R3 may be used to form the third transistor T3 (e.g., see FIG. 1). Although the first to third regions R1, R2, and R3 are illustrated in FIGS. 4A to 6A to be direct contact with each other, in some embodiments the first to third regions R1, R2, and R3 may be spatially and electrically separated from each other.

Active patterns F1, F2, and F3 may be formed on the first to third regions R1, R2, and R3 of the substrate 100, respectively. Each of the active patterns F1, F2, and F3 may be formed to have a fin shape. For example, each of the active patterns F1, F2, and F3 may be a line- or bar-shaped structure, on the substrate 100, extending in the first direction D1. The active patterns F1, F2, and F3 may be portions of the substrate 100 or may be formed by etching an epitaxial layer grown from the substrate 100. The active patterns F1, F2, and F3 may be formed of or include at least one of IV-IV or III-V compound semiconductor materials. The IV-IV compound semiconductor materials may include binary or ternary compounds, in which at least two different elements of carbon (C), silicon (Si), germanium (Ge), or tin (Sn) are contained, or which is doped with a group IV element. Furthermore, the III-V compound semiconductor materials may include binary, ternary, or quaternary compounds, in which at least one of group III elements (e.g., aluminum (Al), gallium (Ga), and indium (In)) and one of group V elements (e.g., phosphorus (P), arsenic (As), and antimony (Sb)) are contained.

Sacrificial gate patterns 190, 290, and 390 may be formed to cross the active patterns F1, F2, and F3, respectively. The sacrificial gate patterns 190, 290, and 390 may be formed to have a line or bar shape extending in the second direction D2. The sacrificial gate patterns 190, 290, and 390 may be formed by forming a sacrificial layer on the substrate 100 and patterning the sacrificial layer. In some embodiments, the sacrificial layer may be formed of poly silicon.

Figure 5A:
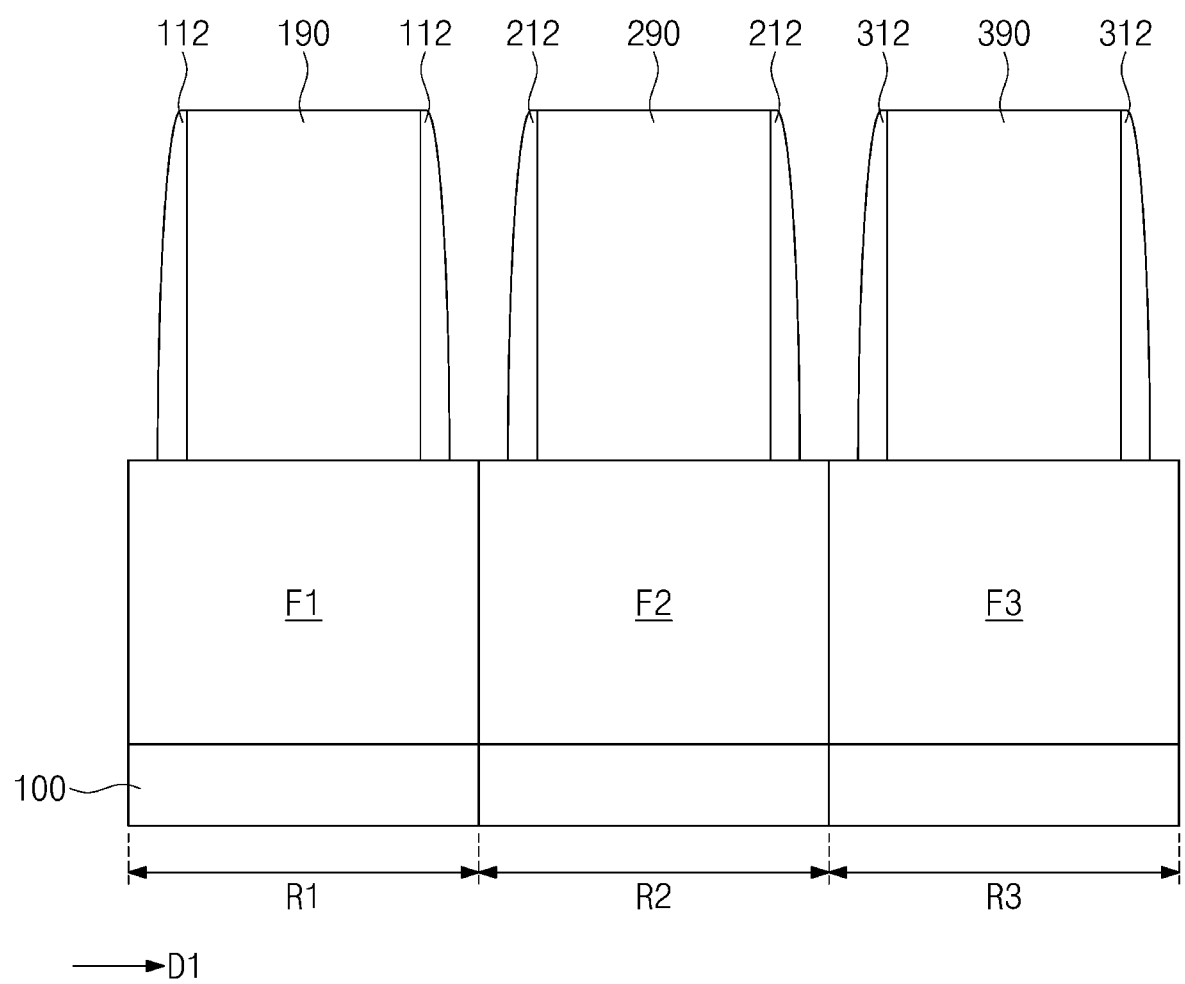
Figure 5B:
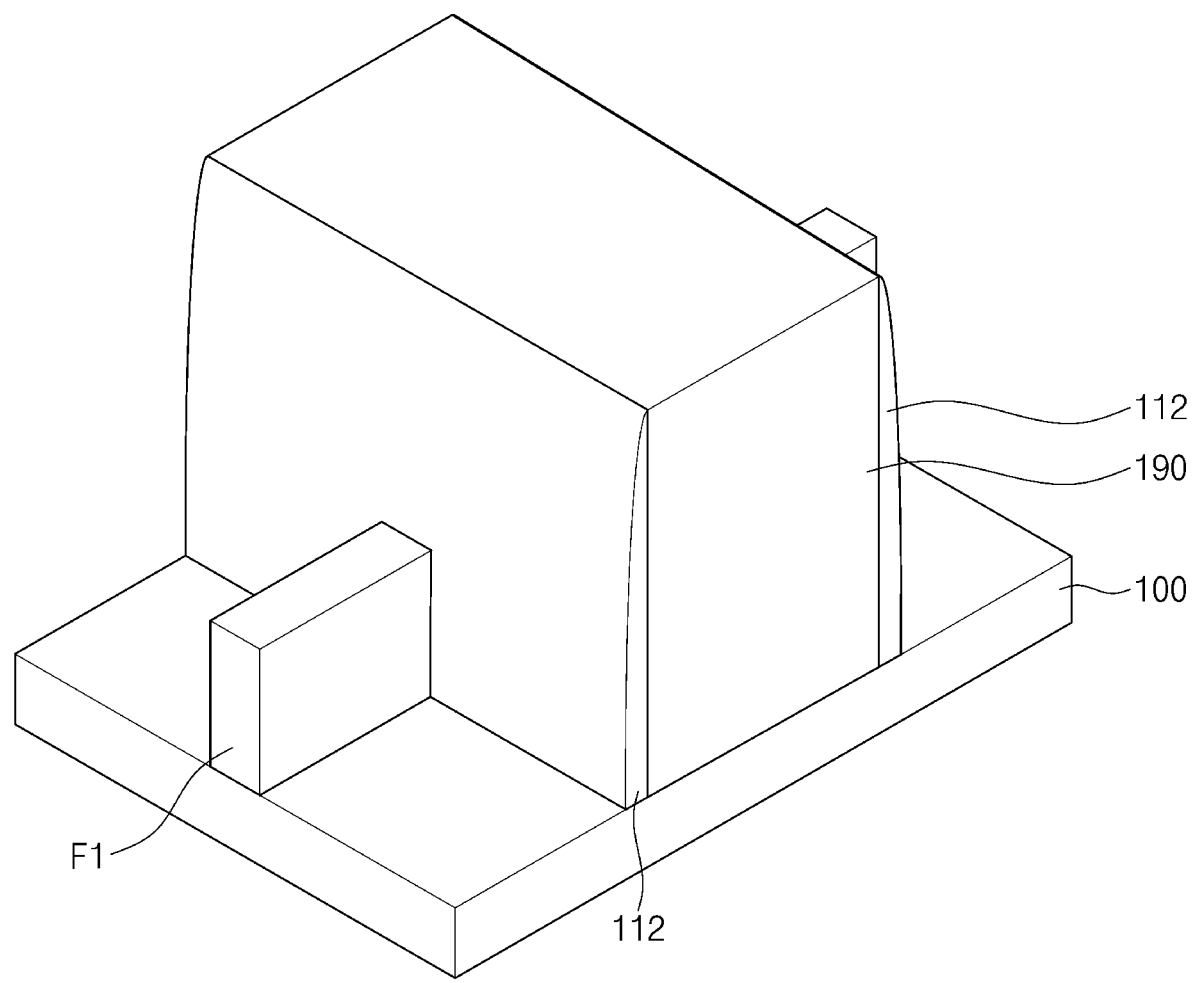

Referring to FIGS. 5A and 5B, spacers 112, 212, and 312 may be formed on side surfaces of the sacrificial gate patterns 190, 290, and 390, respectively. The spacers 112, 212, and 312 may be formed of or include at least one of silicon carbon nitride (SiCN), silicon carbon oxynitride (SiCON), or silicon nitride (SiN). The formation of the spacers 112, 212, and 312 may include forming a spacer layer on the substrate 100 using a deposition process (e.g., CVD or ALD) and anisotropically etching the spacer layer.

Figure 6A:
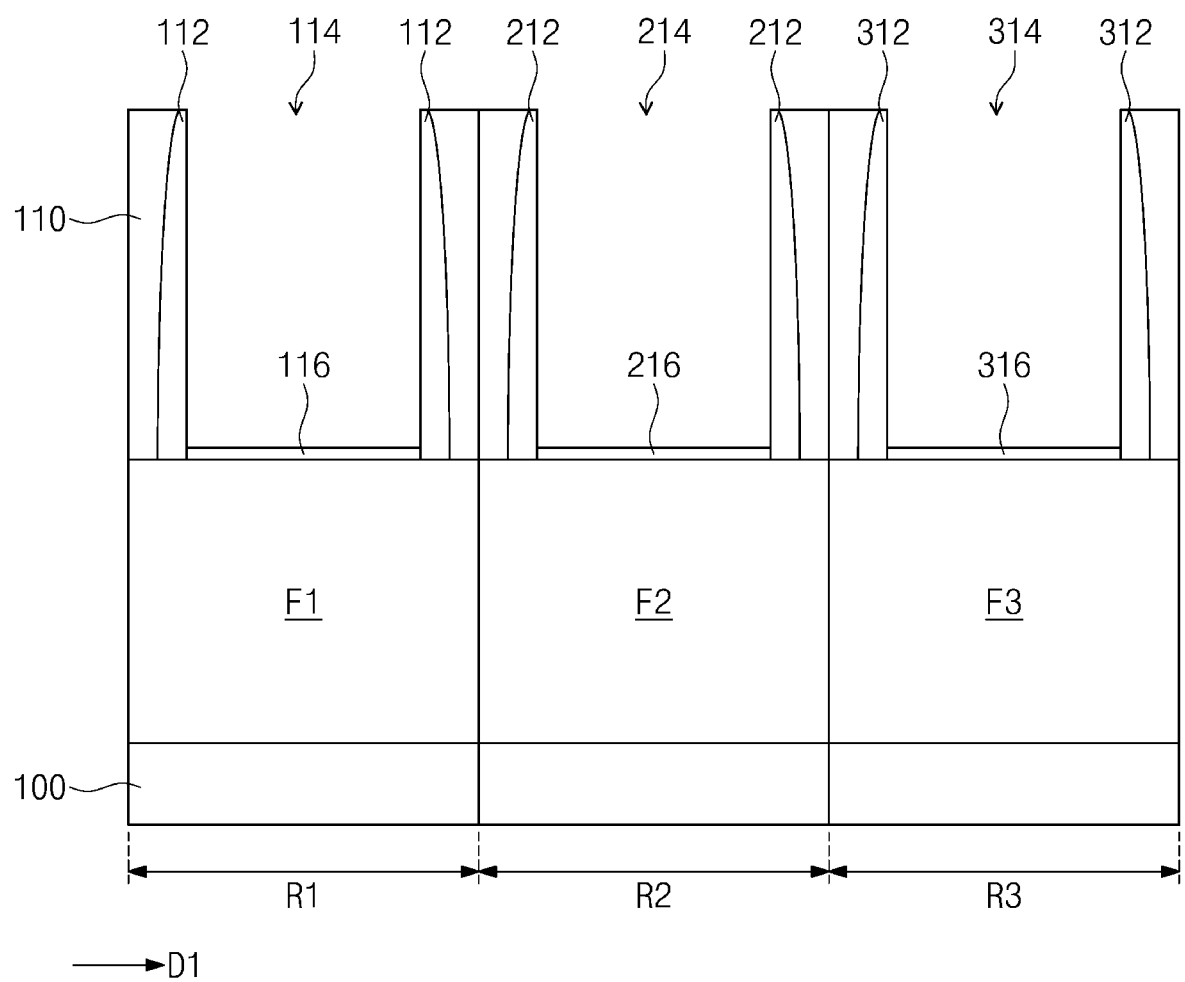
Figure 6B:
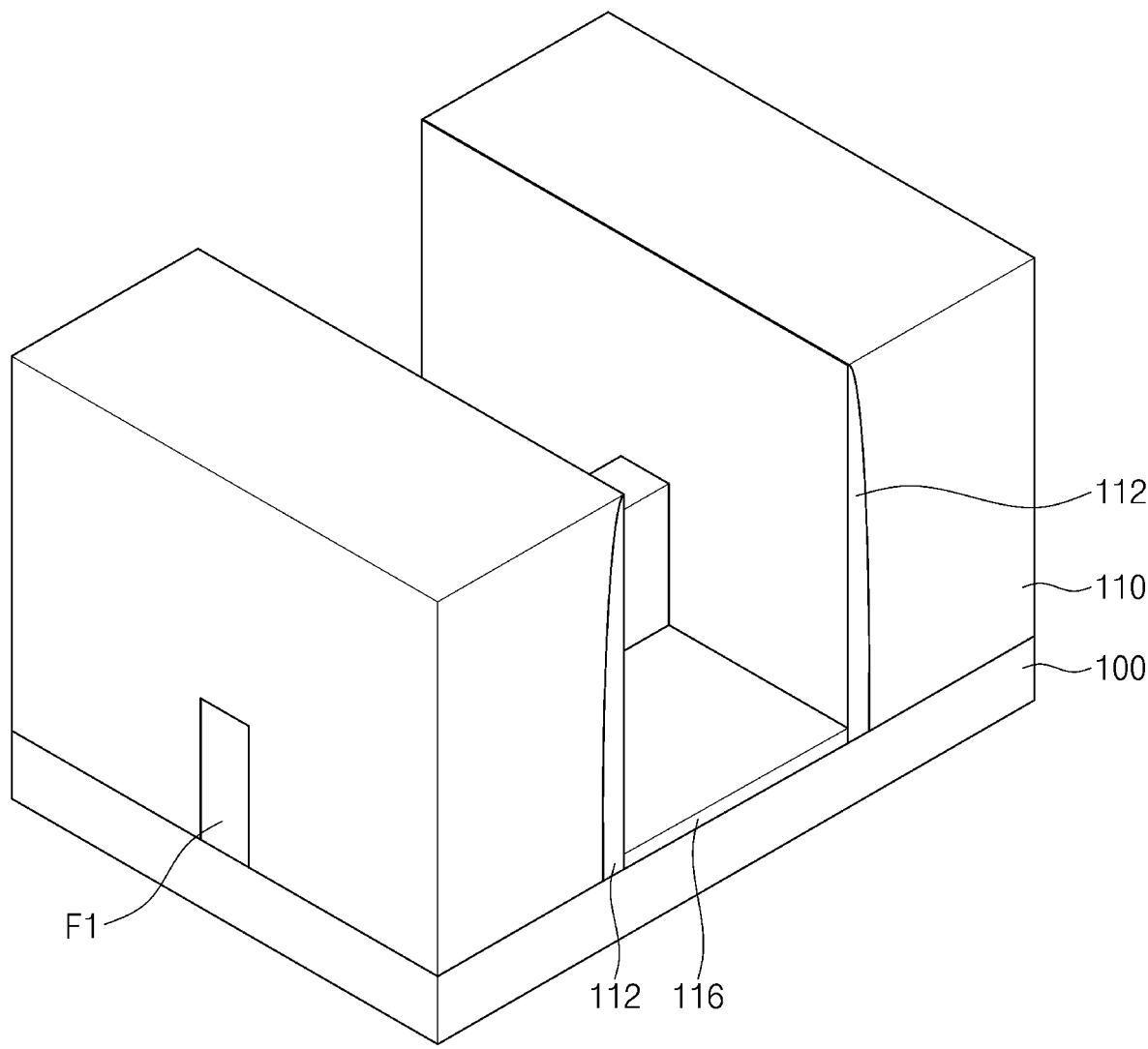

Referring to FIGS. 6A and 6B, the interlayered insulating layer 110 may be formed on the substrate 100. The formation of the interlayered insulating layer 110 may include forming an insulating layer on the substrate 100 and recessing the insulating layer to expose top surfaces of the sacrificial gate patterns 190, 290, and 390. The interlayered insulating layer 110 may be formed to have a top surface that is substantially coplanar with the top surfaces of the sacrificial gate patterns 190, 290, and 390. Thereafter, the sacrificial gate patterns 190, 290, and 390 may be selectively removed to form the trenches 114, 214, and 314 on the first to third regions R1, R2, and R3, respectively.

The interface layers 116, 216, and 316 may be formed in the trenches 114, 214, and 314, respectively. The interface layers 116, 216, and 316 may be formed by, for example, a chemical oxidation method, an ultraviolet light oxidation method, or a dual plasma oxidation method. The interface layers 116, 216, and 316 may be formed to cover bottom surfaces of the trenches 114, 214, and 314, respectively, to conformally cover the active patterns F1, F2, and F3 in the trenches 114, 214, and 314, and to expose side surfaces of the trenches 114, 214, and 314. The interface layers 116, 216, and 316 may be formed of or include a silicon oxide layer.

The formation of the first to third transistors T1, T2, and T3 (e.g., see FIG. 1) may further include forming the gate electrodes 180, 280, and 380 (e.g., see FIG. 1) in the trenches 114, 214, and 314 of the first to third regions R1, R2, and R3, respectively. Hereinafter, operations of methods of forming the gate electrodes 180, 280, and 380 will be described in more detail with reference to FIGS. 7 to 16.

FIGS. 7 to 16 are cross-sectional views illustrating operations of methods of fabricating semiconductor devices according to some embodiments of the inventive concepts. As illustrated in FIG. 1, a plurality of material layers for forming the gate electrodes 180, 280, and 380 may be sequentially stacked in each of the trenches 114, 214, and 314, but in order to reduce complexity in the drawings and to provide better understanding of the inventive concepts, each of the material layers may be illustrated as being flat.

Figure 7:
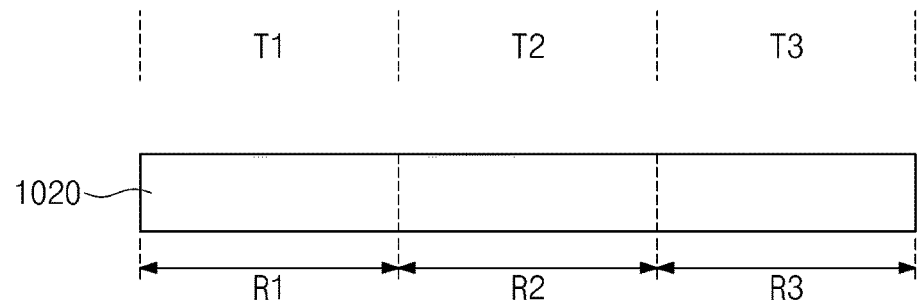
FIGS. 7 to 16 are cross-sectional view illustrating operations of methods of fabricating semiconductor devices according to some embodiments of the inventive concepts.

Referring to FIG. 7, a dielectric layer 1020 may be formed in each of trenches, which are formed in the first to third regions R1, R2, and R3. The dielectric layer 1020 may include a high-k dielectric insulating layer. For example, the dielectric layer 1020 may contain hafnium (Hf) or zirconium (Zr). The dielectric layer 1020 may be formed by a chemical vapor deposition (CVD) method or an atomic layer deposition (ALD) method. To adjust a work function of the dielectric layer 1020, the dielectric layer 1020 may be doped with a work function adjusting element (e.g., lanthanum (La) or aluminum (Al)). In some embodiments, the doping process of the work function adjusting element may be omitted.

Figure 8:
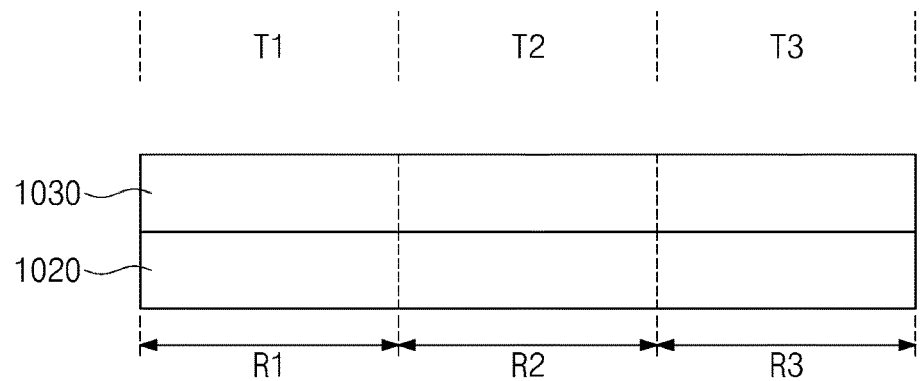

Referring to FIG. 8, a first conductive layer 1030 may be formed on the first to third regions R1, R2, and R3. The first conductive layer 1030 may be used to adjust a work function of a gate electrode. The first conductive layer 1030 may be formed by a chemical vapor deposition (CVD) method or an atomic layer deposition (ALD) method. The first conductive layer 1030 may be formed of or include at least one of binary metal nitride compounds (e.g., titanium nitride (TiN) and tantalum nitride (TaN)), ternary metal nitride compounds (e.g., titanium aluminum nitride (TiAlN), tantalum aluminum nitride (TaAlN), titanium silicon nitride (TiSiN), and tantalum silicon nitride (TaSiN)), or metal oxynitride compounds formed by oxidation thereof.

Figure 9:
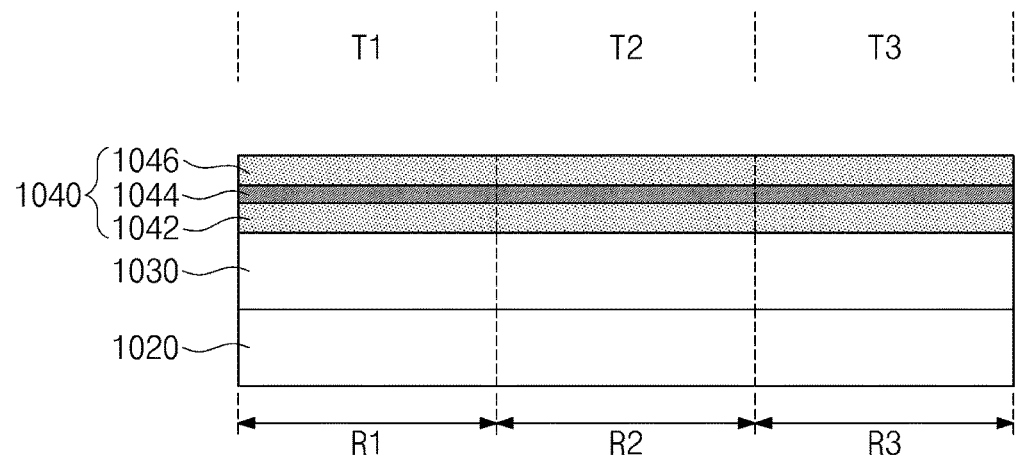

Referring to FIG. 9, a barrier layer 1040 may be formed on the first to third regions R1, R2, and R3. In some embodiments, the barrier layer 1040 may be formed by sequentially depositing a first barrier layer 1042, a second barrier layer 1044, and a sacrificial layer 1046 on the first conductive layer 1030. Each or at least one of the first barrier layer 1042, the second barrier layer 1044, and the sacrificial layer 1046 may be formed by a chemical vapor deposition (CVD) method, an atomic layer deposition (ALD) method, or a wet oxidation method. The first barrier layer 1042 may be formed of or include a same material as the sacrificial layer 1046. For example, the first barrier layer 1042 and the sacrificial layer 1046 may be formed of or include metal nitride, such as tantalum nitride (TaN), tungsten nitride (WN), silicon nitride (SiN), or aluminum nitride (AlN). The second barrier layer 1044 may be formed of or include a material different from that of the sacrificial layer 1046. For example, the second barrier layer 1044 may be formed of or include at least one of metal oxides, such as tantalum oxide (TaO), tungsten oxide ($WO_x$), silicon oxide ($SiO_2$), or aluminum oxide ($Al_2O_3$). The barrier layer 1040 may be used to prevent the first conductive layer 1030 from being unintentionally etched in a subsequent etching process or may be used as an etch stop layer. At least two of the first barrier layer 1042, the sacrificial layer 1046, and the second barrier layer 1044 may be formed to have an etch selectivity (e.g., different etch rates) with respect to each other.

Figure 10:
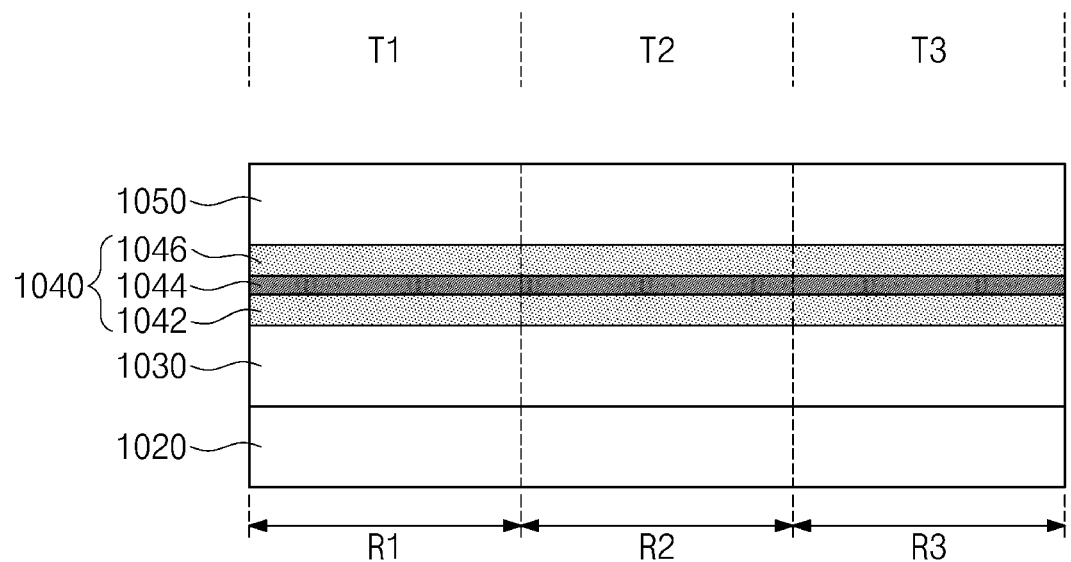

Referring to FIG. 10, a second conductive layer 1050 may be formed on the first to third regions R1, R2, and R3. The second conductive layer 1050 may be formed by a chemical vapor deposition (CVD) method or an atomic layer deposition (ALD) method. The second conductive layer 1050 may be formed of or include at least one of aluminum-containing metal compounds, oxides thereof, nitrides thereof, or carbides thereof. In some embodiments, the second conductive layer 1050 may be formed of or include at least one of titanium aluminum carbide (TiAlC), titanium aluminum nitride (TiAlN), titanium aluminum carbon nitride (TiAlCN), or titanium aluminum (TiAl).

Figure 11:
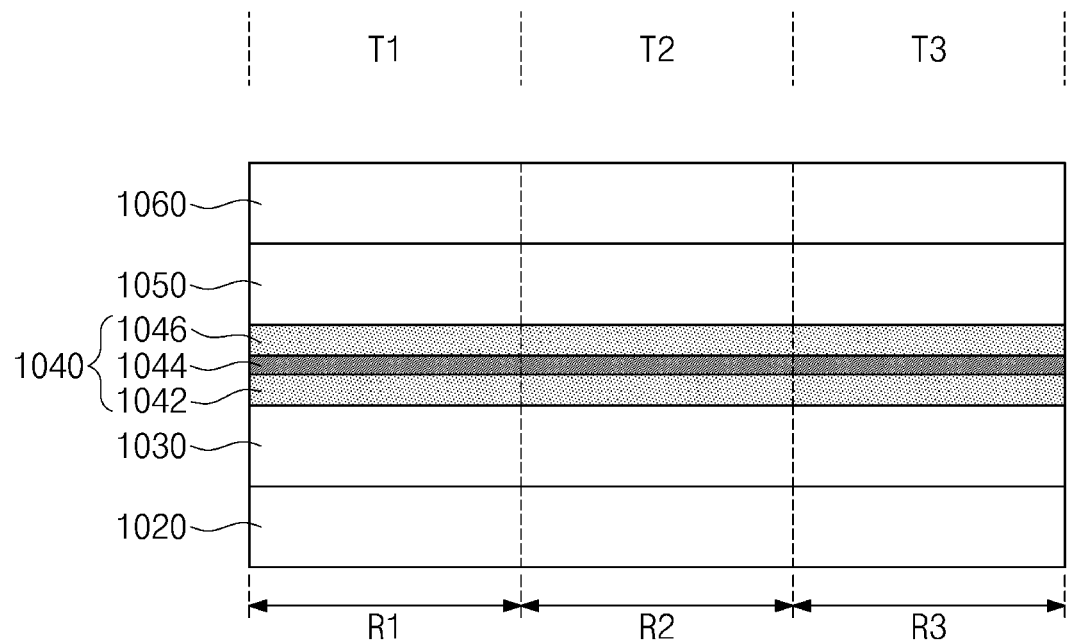

Referring to FIG. 11, a third conductive layer 1060 may be formed on the first to third regions R1, R2, and R3. The third conductive layer 1060 may be used to adjust a work function of a gate electrode. The third conductive layer 1060 may be formed by, for example, a chemical vapor deposition (CVD) method or an atomic layer deposition (ALD) method. The third conductive layer 1060 may be formed of or include at least one of binary metal nitride compounds (e.g., titanium nitride (TiN) and tantalum nitride (TaN)), ternary metal nitride compounds (e.g., titanium aluminum nitride (TiAlN), tantalum aluminum nitride (TaAlN), titanium silicon nitride (TiSiN), and tantalum silicon nitride (TaSiN)), or metal oxynitride compounds formed by oxidation thereof.

Figure 12:
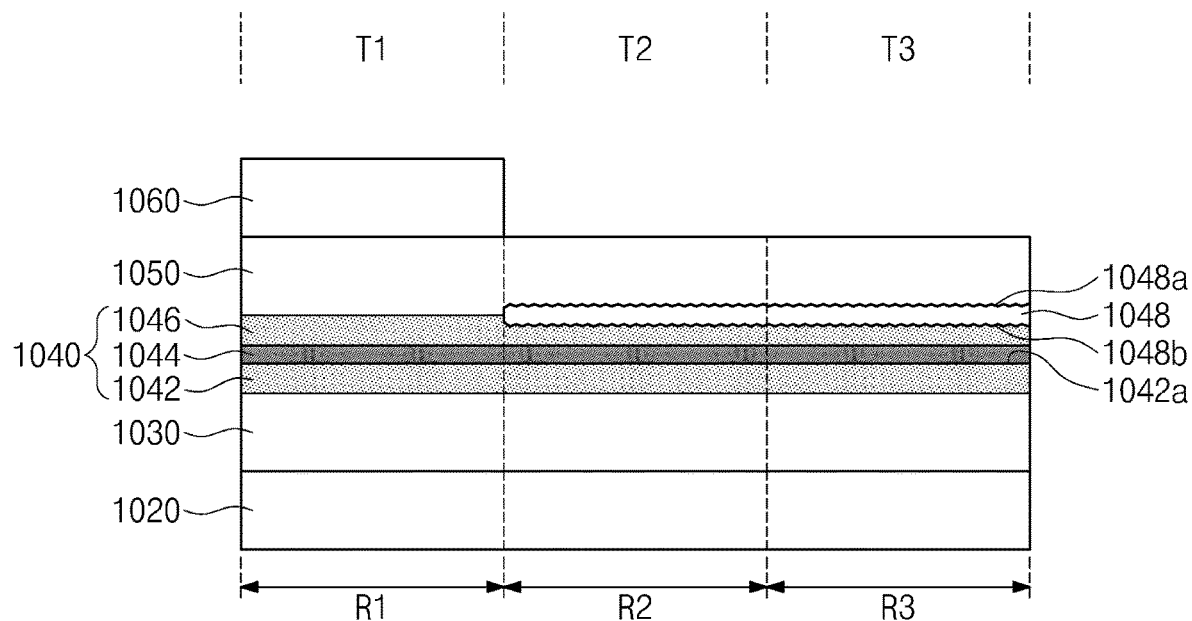

Referring to FIG. 12, the third conductive layer 1060 may be removed from the second region R2 and the third region R3. As an example, the removal of the third conductive layer 1060 may include forming a mask pattern on the first region R1 and etching the third conductive layer 1060 to selectively remove the third conductive layer 1060 from the second and third regions R2 and R3. The etching process of the third conductive layer 1060 may include a wet etching process. In some embodiments, the wet etching process may be performed using an etchant containing hydrogen peroxide ($H_2O_2$), ammonium hydroxide ($NH_4OH$), water ($H_2O$), sulfuric acid ($H_2SO_4$), hydrochloric acid (HCl), or mixtures thereof.

During the etching process of the third conductive layer 1060, an intermixing layer 1048 may be formed between the sacrificial layer 1046 and the second conductive layer 1050 and on the second region R2 and the third region R3. As an example, the etching process of the third conductive layer 1060 may be performed at a high process temperature and oxygen atoms contained in the etchant for the etching process may be diffused into the second conductive layer 1050. Furthermore, under the high temperature environment, elements constituting the sacrificial layer 1046 may be mixed with elements constituting the second conductive layer 1050 near an interface between the sacrificial layer 1046 and the second conductive layer 1050 to form the intermixing layer 1048. The intermixing layer 1048 may be formed to have an irregular surface profile, and for example, a top surface 1048a and a bottom surface 1048b of the intermixing layer 1048 may have a high roughness. As an example, the top and bottom surfaces 1048a and 1048b of the intermixing layer 1048 may be coarse in comparison with the substantially flat top surface 1042a of the first barrier layer 1042. Hence, the sacrificial layer 1046 and the second conductive layer 1050, which are in direct contact with the intermixing layer 1048, may also have rough surfaces, as illustrated in FIG. 12. The intermixing layer 1048 may be formed of or include an oxynitride material, in which at least two different metallic elements are contained. The intermixing layer 1048 may be formed of a material containing a metallic element of the sacrificial layer 1046, a metallic element of the second conductive layer 1050, and an oxygen atom diffused from the second conductive layer 1050. As an example, in the case where the sacrificial layer 1046 includes tantalum nitride (TaN) and the second conductive layer 1050 includes titanium nitride (TiN), the intermixing layer 1048 may include titanium tantalum oxynitride (Ti/Ta—N—O).

Figure 13:
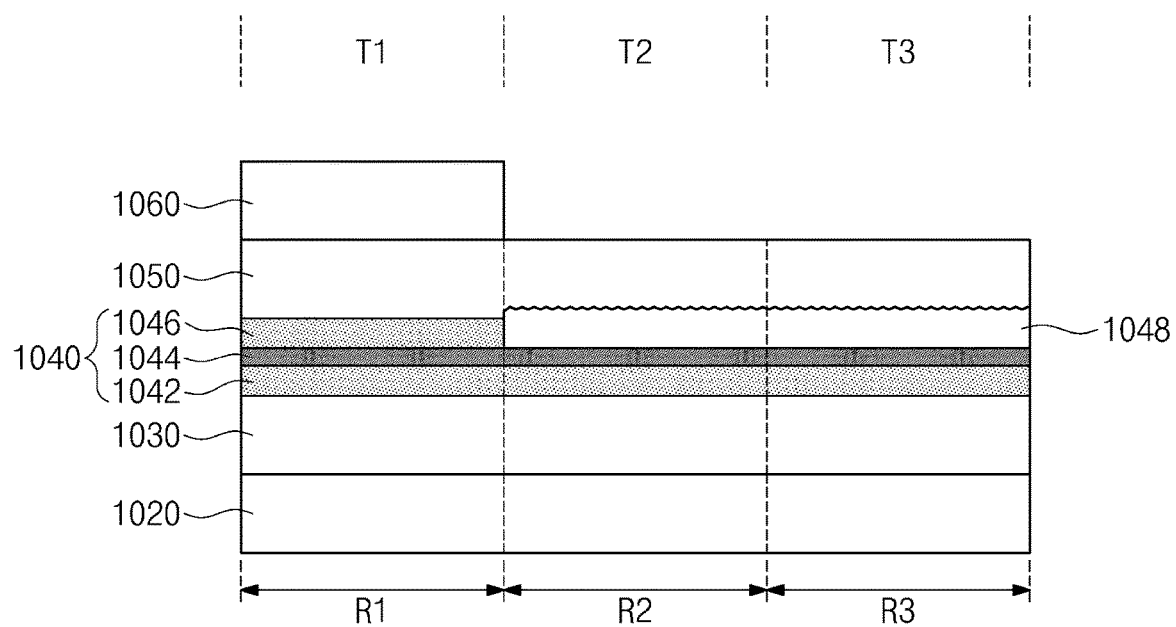

In some embodiments, as illustrated in FIG. 13, the entire portion of the sacrificial layer 1046 on the second and third regions R2 and R3 may be mixed with a portion of the second conductive layer 1050 to form the intermixing layer 1048. For example, in the case where a process time for the etching process of the third conductive layer 1060 is increased, the formation of the intermixing layer 1048 may start from a top portion of the sacrificial layer 1046 and may continue until the sacrificial layer 1046 is wholly consumed. Oxygen atoms contained in the etchant for the etching process may not be diffused into the first barrier layer 1042 by the second barrier layer 1044. The description that follows will refer to some embodiments in which the intermixing layer 1048 is formed to have the structure of FIG. 12.

Figure 14:
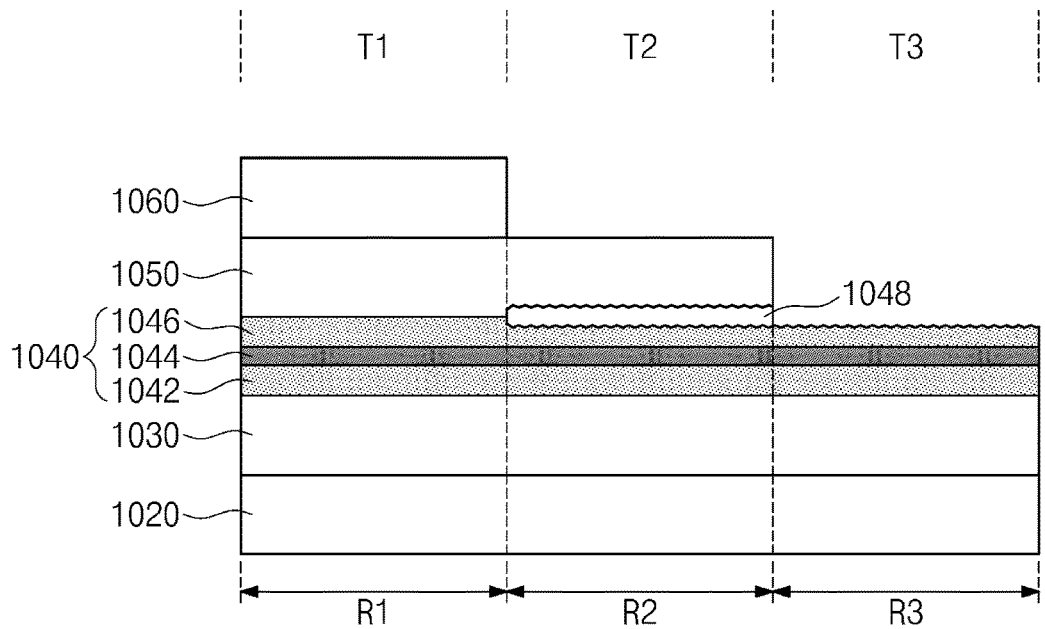

Referring to FIG. 14, the second conductive layer 1050 may be removed from the third region R3. For example, the formation of the second conductive layer 1050 may include forming a mask pattern on the first region R1 and the second region R2 and selectively etching a portion of the second conductive layer 1050 on the third region R3. The etching of the second conductive layer 1050 may include a wet etching process. For example, the wet etching process may be performed using an etchant containing hydrogen peroxide ($H_2O_2$), ammonium hydroxide ($NH_4OH$), water ($H_2O$), sulfuric acid ($H_2SO_4$), hydrochloric acid (HCl) or mixtures thereof. The intermixing layer 1048 may be removed from the third region R3 during the etching of the second conductive layer 1050. After the partial removal of the intermixing layer 1048, an exposed top surface of the sacrificial layer 1046 on the third region R3 may have high roughness.

Figure 15:
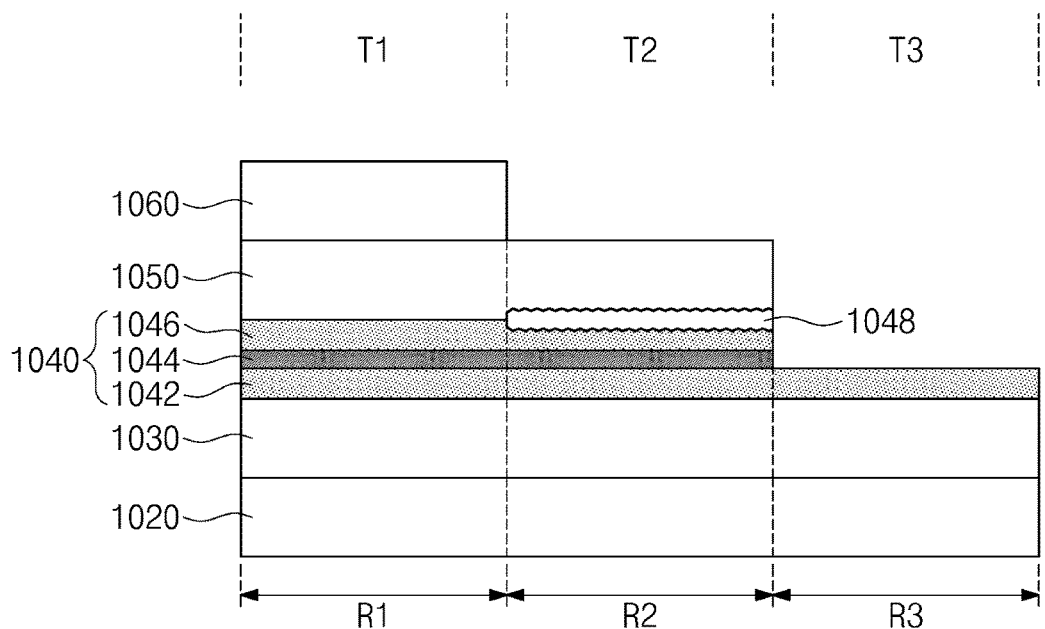

Referring to FIG. 15, the sacrificial layer 1046 and the second barrier layer 1044 may be removed from the third region R3. As an example, the sacrificial layer 1046 and the second barrier layer 1044 may have an etch selectivity with respect to each other, the sacrificial layer 1046 may be selectively etched using the etch selectivity, and then, the second barrier layer 1044 may be etched. In the case where the sacrificial layer 1046 and the second barrier layer 1044 are removed from the third region R3, the exposed top surface of the first barrier layer 1042 may have a substantially flat surface profile. The first barrier layer 1042 and the second barrier layer 1044 may have an etch selectivity with respect to each other, and this etch selectivity may be used to prevent the first barrier layer 1042 from being etched during the etching process of the second barrier layer 1044. Thus, a thickness of the first barrier layer 1042 after the etching process of the second barrier layer 1044 may be substantially equal to a thickness of the first barrier layer 1042 before the etching process of the third conductive layer 1060, and the first barrier layer 1042 may have a uniform thickness on the first to third regions R1, R2, and R3.

Figure 16:
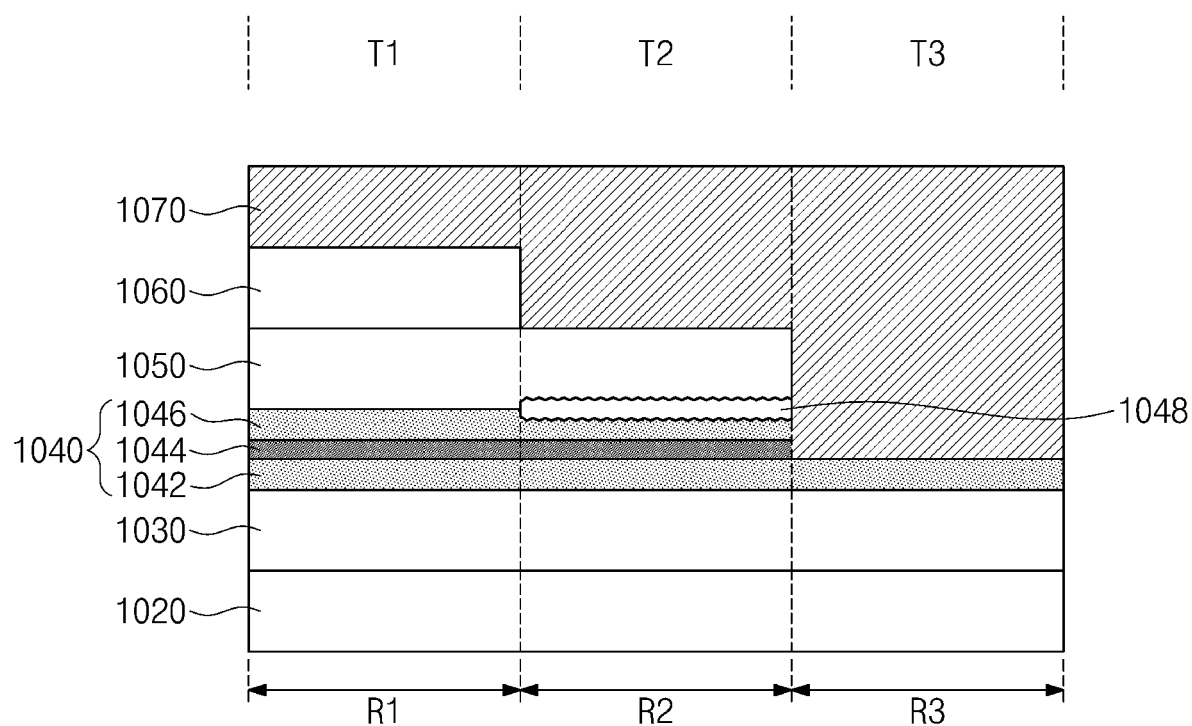

Referring to FIG. 16, a conductive pattern 1070 may be formed on the first to third regions R1, R2, and R3. In some embodiments, a planarization process may be performed on the structure on the substrate 100. As a result of the planarization process, the dielectric layer 1020, the first conductive layer 1030, the barrier layer 1040, the second conductive layer 1050, and the third conductive layer 1060 may be patterned to form separate patterns (e.g., the dielectric layers 120, 220, and 320, the first conductive layers 130, 230, and 330, the barrier layers 140, 240, and 340, the second conductive layers 150, 250, and 350, and the third conductive layers 160, 260, and 360), as illustrated in FIG. 1. The afore-described method may be used to form the transistors T1, T2, and T3, whose work functions are different from each other, on the substrate 100.

According to some embodiments of the inventive concepts, operations of methods of fabricating a semiconductor device may include forming the barrier layer 1040 having a multi-layered structure. The second barrier layer 1044 may be used to prevent oxygen atoms in etchant from being diffused during an etching process. Furthermore, when an etching process is performed on the conductive layers 1050 and 1060 on the barrier layer 1040, the intermixing layer 1048 having an irregular surface profile may be formed between the barrier layer 1040 and the conductive layers 1050 and 1060. However, the intermixing layer 1048 may be formed on the sacrificial layer 1046, which may be removed by a subsequent process, and thus, it may be possible to prevent or suppress thicknesses of the first and second barrier layers 1042 and 1044 from being reduced. Accordingly, it may be possible to easily form the first and second barrier layers 1042 and 1044 with desired thicknesses. Furthermore, it may be possible to improve uniformity in thickness of each of the first and second barrier layers 142, 242, 342, 144, 244, and 344 of the semiconductor device. As a result, it may be possible to reduce a process variation in a process of fabricating a semiconductor device.

While example embodiments of the inventive concepts have been particularly illustrated and described, it will be understood by one of ordinary skill in the art that variations in form and detail may be made therein without departing from the spirit and scope of the attached claims.

What is claimed is:

1. A semiconductor device comprising:
   a substrate having an active region; and
   a first transistor, a second transistor, and a third transistor on the active region of the substrate, each of the first transistor, the second transistor, and the third transistor including:
      a dielectric layer on the substrate,
      a conductive pattern on the dielectric layer,
      a barrier layer between the dielectric layer and the conductive pattern, and
      a first conductive layer between the dielectric layer and the barrier layer,
   wherein each of the first transistor and the second transistor further includes a second conductive layer between the barrier layer and the conductive pattern,
   wherein a top surface of the barrier layer of the second transistor has a roughness that is higher than a roughness of a substantially flat top surface of the barrier layer of the first transistor.

2. The semiconductor device of claim 1, wherein the second transistor further includes an intermixing layer is formed between the barrier layer and the second conductive layer, and
   the second conductive layer of the first transistor is in contact with the barrier layer of the first transistor.

3. The semiconductor device of claim 2, wherein a bottom surface or a top surface of the intermixing layer has a roughness that is higher than the roughness of the substantially flat top surface of the barrier layer of the first transistor.

4. The semiconductor device of claim 2, wherein a bottom surface of the barrier layer of the second transistor directly contact with the intermixing layer, and
   the bottom surface of the barrier layer of the second transistor has a roughness that is higher than the roughness of the top surface of the barrier layer of the second transistor.

5. The semiconductor device of claim 1, wherein the conductive pattern of the third transistor is in contact with the barrier layer of the third transistor.

6. The semiconductor device of claim 1, wherein the barrier layer of each of the first transistor and the second transistor comprises a first barrier layer, a second barrier layer and a sacrificial layer, and
   the barrier layer of the third transistor comprises a first barrier layer which is in direct contact with the conductive pattern of the third transistor.

7. The semiconductor device of claim 6, wherein the second barrier layer of the second transistor has a thickness that is less than a thickness of the second barrier layer of the first transistor.

8. The semiconductor device of claim 6, wherein the top surface of the intermixing layer of the second transistor comprises a roughness that is higher than a roughness of a top surface of the first barrier layer of the second transistor.

9. The semiconductor device of claim 1, wherein the first transistor further includes a third conductive layer between the second conductive layer and the conductive pattern.

10. The semiconductor device of claim 1, wherein each of the first transistor, the second transistor, and the third transistors comprises:
    a fin extending in a first direction on the substrate; and
    a gate electrode crossing the fin, the gate electrode facing a top surface and both side surfaces of the fin, and
    wherein the dielectric layer, the conductive pattern, the barrier layer and the first conductive layer constitute the gate electrode.

11. A semiconductor device comprising:
    a substrate; and
    a first transistor, a second transistor, a third transistor on the substrate, each of the first transistor, the second transistor, and the third transistor including:
       a fin extending in a first direction on the substrate, and
       a gate electrode crossing the fin and facing a top surface and both side surfaces of the fin, the gate electrode comprising a dielectric layer, a first conductive layer, a barrier layer and a conductive pattern sequentially stacked,
    wherein each of the first transistor and the second transistor further includes a second conductive layer between the barrier layer and the conductive pattern,
    wherein the second transistor further includes an intermixing layer between the barrier layer and the second conductive layer,
    wherein a top surface of the intermixing layer of the second transistor has a roughness that is higher than a roughness of a substantially flat top surface of the barrier layer of the first transistor.

12. The semiconductor device of claim 11, wherein a top surface of the barrier layer of the second transistor has a roughness that is higher than the roughness of the substantially flat top surface of the barrier layer of the first transistor.

13. The semiconductor device of claim 11, wherein the barrier layer of each of the first transistor and the second transistor comprises a first barrier layer, a second barrier layer and a sacrificial layer, and
the barrier layer of the third transistor comprises a first barrier layer which is in direct contact with the conductive pattern of the third transistor.

14. The semiconductor device of claim 13, wherein the second barrier layer of the second transistor has a thickness that is less than a thickness of the second barrier layer of the first transistor.

15. The semiconductor device of claim 13, wherein the roughness of the top surface of the intermixing layer of the second transistor is higher than a roughness of a top surface of the first barrier layer of the second transistor.

16. The semiconductor device of claim 11, wherein the barrier layer of the first transistor comprises a first barrier layer, a second barrier layer and a sacrificial layer, the barrier layer of the second transistor comprises a first barrier layer and a second barrier layer, the second barrier layer of the second transistor is in direct contact with the intermixing layer of the second transistor, and
the barrier layer of the third transistor comprises a first barrier layer which is in direct contact with the conductive pattern of the third transistor.

17. The semiconductor device of claim 11, wherein an interface between the first barrier layer and the second barrier layer is substantially flat.

18. The semiconductor device of claim 11, wherein the second conductive layer of the first transistor directly contacts with the barrier layer of the first transistor.

19. The semiconductor device of claim 11, wherein the intermixing layer comprises an oxynitride material, in which a metallic element of the second conductive layer is contained.

20. The semiconductor device of claim 11, wherein the first transistor further includes a third conductive layer between the second conductive layer and the conductive pattern.

* * * * *